(12) United States Patent
Marino et al.

(10) Patent No.: US 10,536,123 B2
(45) Date of Patent: Jan. 14, 2020

(54) VOLUME INTERACTIONS FOR CONNECTED PLAYBACK DEVICES

(71) Applicant: Sonos, Inc., Santa Barbara, CA (US)

(72) Inventors: Frank Marino, Penfield, NY (US); Eduardo Ahumada Apodaca, San Diego, CA (US); Robert Andrew Lambourne, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 16/404,065

(22) Filed: May 6, 2019

(65) Prior Publication Data

US 2019/0326869 A1 Oct. 24, 2019

Related U.S. Application Data

(63) Continuation of application No. 15/954,351, filed on Apr. 16, 2018, now Pat. No. 10,284,158, which is a
(Continued)

(51) Int. Cl.
*H03G 3/30* (2006.01)
*H03G 3/20* (2006.01)
(Continued)

(52) U.S. Cl.
CPC .......... *H03G 3/3005* (2013.01); *G06F 3/165* (2013.01); *H03G 3/10* (2013.01); *H03G 3/20* (2013.01);
(Continued)

(58) Field of Classification Search
CPC .......... H03G 3/3005; H03G 3/20; H03G 3/10; H03G 11/00; G06F 3/165; H04R 3/12; H04R 2227/005
(Continued)

(56) References Cited

U.S. PATENT DOCUMENTS

| 5,182,552 A | 1/1993 | Paynting |
| 5,239,458 A | 8/1993 | Suzuki |

(Continued)

FOREIGN PATENT DOCUMENTS

| EP | 1389853 A1 | 2/2004 |
| EP | 2194471 A1 | 6/2010 |

(Continued)

OTHER PUBLICATIONS

AudioTron Quick Start Guide, Version 1.0, Mar. 2001, 24 pages.
(Continued)

*Primary Examiner* — Paul Kim

(57) ABSTRACT

Methods and systems are provided for volume interactions for connected playback devices. In an example implementation, a first playback device applies a state variable update associated with a group of playback devices comprising the first playback device and one or more second playback devices. The state variable update indicates a limited volume range associated with the first playback device. The first playback device renders audio content in synchrony with the one or more second playback devices. Rendering the audio content involves a subwoofer speaker of the first playback device rendering a bass frequency component of the audio content. The first playback device receives input data indicating a group volume adjustment for the group of playback devices and adjusting a playback volume of the first playback device based on the group volume adjustment and the limited volume range.

20 Claims, 8 Drawing Sheets

Related U.S. Application Data continuation of application No. 15/248,342, filed on Aug. 26, 2016, now Pat. No. 9,948,258, which is a continuation of application No. 14/808,923, filed on Jul. 24, 2015, now Pat. No. 9,455,679, which is a continuation of application No. 14/634,365, filed on Feb. 27, 2015, now Pat. No. 9,379,683, which is a continuation of application No. 13/564,541, filed on Aug. 1, 2012, now Pat. No. 8,995,687.

(51) Int. Cl.
    *H04R 3/12*     (2006.01)
    *H03G 11/00*     (2006.01)
    *H03G 3/10*     (2006.01)
    *G06F 3/16*     (2006.01)

(52) U.S. Cl.
    CPC .............. *H03G 11/00* (2013.01); *H04R 3/12* (2013.01); *H04R 2227/005* (2013.01)

(58) Field of Classification Search
    USPC ........................................................ 381/105
    See application file for complete search history.

(56) References Cited

U.S. PATENT DOCUMENTS

| | | | |
|---|---|---|---|
| 5,299,266 A | 3/1994 | Lumsden | |
| 5,406,634 A | 4/1995 | Anderson et al. | |
| 5,440,644 A | 8/1995 | Farinelli et al. | |
| 5,751,819 A | 5/1998 | Dorrough | |
| 5,761,320 A | 6/1998 | Farinelli et al. | |
| 5,923,902 A | 7/1999 | Inagaki | |
| 6,026,150 A | 2/2000 | Frank et al. | |
| 6,032,202 A | 2/2000 | Lea et al. | |
| 6,256,554 B1 | 7/2001 | DiLorenzo | |
| 6,404,811 B1 | 6/2002 | Cvetko et al. | |
| 6,430,353 B1 | 8/2002 | Honda et al. | |
| 6,469,633 B1 | 10/2002 | Wachter et al. | |
| 6,487,296 B1 | 11/2002 | Allen et al. | |
| 6,522,886 B1 | 2/2003 | Youngs et al. | |
| 6,611,537 B1 | 8/2003 | Edens et al. | |
| 6,631,410 B1 | 10/2003 | Kowalski et al. | |
| 6,643,744 B1 | 11/2003 | Cheng | |
| 6,728,531 B1 | 4/2004 | Lee et al. | |
| 6,757,517 B2 | 6/2004 | Chang et al. | |
| 6,778,869 B2 | 8/2004 | Champion | |
| 6,826,283 B1 | 11/2004 | Wheeler et al. | |
| 6,985,694 B1 | 1/2006 | De Bonet et al. | |
| 7,130,608 B2 | 10/2006 | Hollstrom et al. | |
| 7,130,616 B2 | 10/2006 | Janik | |
| 7,143,939 B2 | 12/2006 | Henzerling | |
| 7,187,947 B1 | 3/2007 | White et al. | |
| 7,218,708 B2 | 5/2007 | Berezowski et al. | |
| 7,236,773 B2 | 6/2007 | Thomas | |
| 7,295,548 B2 | 11/2007 | Blank et al. | |
| 7,312,785 B2 | 12/2007 | Tsuk et al. | |
| 7,319,764 B1 | 1/2008 | Reid et al. | |
| 7,391,791 B2 | 6/2008 | Balassanian et al. | |
| 7,483,538 B2 | 1/2009 | McCarty et al. | |
| 7,571,014 B1 * | 8/2009 | Lambourne ............ | H04R 27/00 700/94 |
| 7,630,501 B2 | 12/2009 | Blank et al. | |
| 7,643,894 B2 | 1/2010 | Braithwaite et al. | |
| 7,657,910 B1 | 2/2010 | McAulay et al. | |
| 7,668,990 B2 | 2/2010 | Krzyzanowski et al. | |
| 7,672,470 B2 | 3/2010 | Lee | |
| 7,689,305 B2 | 3/2010 | Kreifeldt et al. | |
| 7,742,740 B2 | 6/2010 | Goldberg et al. | |
| 7,835,689 B2 | 11/2010 | Goldberg et al. | |
| 7,853,341 B2 | 12/2010 | McCarty et al. | |
| 7,949,707 B2 | 5/2011 | McDowall et al. | |
| 7,987,294 B2 | 7/2011 | Bryce et al. | |
| 8,014,423 B2 | 9/2011 | Thaler et al. | |
| 8,045,952 B2 | 10/2011 | Qureshey et al. | |
| 8,050,203 B2 | 11/2011 | Jacobsen et al. | |
| 8,050,652 B2 | 11/2011 | Qureshey et al. | |
| 8,074,253 B1 | 12/2011 | Nathan | |
| 8,103,009 B2 | 1/2012 | McCarty et al. | |
| 8,131,390 B2 | 3/2012 | Braithwaite et al. | |
| 8,218,790 B2 | 7/2012 | Bull et al. | |
| 8,234,395 B2 | 7/2012 | Millington et al. | |
| 8,290,603 B1 | 10/2012 | Lambourne et al. | |
| 8,332,414 B2 | 12/2012 | Nguyen et al. | |
| 8,483,853 B1 | 7/2013 | Lambourne et al. | |
| 8,527,876 B2 | 9/2013 | Wood et al. | |
| 8,588,949 B2 | 11/2013 | Lambourne et al. | |
| 8,611,559 B2 | 12/2013 | Sanders | |
| 8,885,851 B2 | 11/2014 | Westenbroek | |
| 8,917,877 B2 | 12/2014 | Haaff et al. | |
| 8,942,252 B2 | 1/2015 | Balassanian et al. | |
| 8,989,406 B2 | 3/2015 | Wong et al. | |
| 9,031,244 B2 | 5/2015 | Lang et al. | |
| 9,052,810 B2 | 6/2015 | Reimann et al. | |
| 9,164,532 B2 | 10/2015 | Millington | |
| 9,231,545 B2 | 1/2016 | Agustin et al. | |
| 9,329,831 B1 | 5/2016 | Fullerton et al. | |
| 9,438,193 B2 | 9/2016 | Dizon et al. | |
| 2001/0042107 A1 | 11/2001 | Palm | |
| 2001/0043592 A1 | 11/2001 | Jimenez et al. | |
| 2002/0003548 A1 | 1/2002 | Krusche et al. | |
| 2002/0022453 A1 | 2/2002 | Balog et al. | |
| 2002/0026442 A1 | 2/2002 | Lipscomb et al. | |
| 2002/0089529 A1 | 7/2002 | Robbin | |
| 2002/0109710 A1 | 8/2002 | Holtz et al. | |
| 2002/0124097 A1 | 9/2002 | Isely et al. | |
| 2002/0165921 A1 | 11/2002 | Sapieyevski | |
| 2002/0188762 A1 | 12/2002 | Tomassetti et al. | |
| 2003/0020763 A1 | 1/2003 | Mayer et al. | |
| 2003/0023741 A1 | 1/2003 | Tomassetti et al. | |
| 2003/0157951 A1 | 8/2003 | Hasty | |
| 2003/0210796 A1 | 11/2003 | McCarty et al. | |
| 2004/0008852 A1 | 1/2004 | Also et al. | |
| 2004/0010727 A1 | 1/2004 | Fujinami | |
| 2004/0015252 A1 | 1/2004 | Aiso et al. | |
| 2004/0024478 A1 | 2/2004 | Hans et al. | |
| 2004/0131192 A1 | 7/2004 | Metcalf | |
| 2005/0047605 A1 | 3/2005 | Lee et al. | |
| 2005/0251273 A1 | 11/2005 | Bychowsky et al. | |
| 2005/0289224 A1 | 12/2005 | Deslippe et al. | |
| 2006/0008256 A1 | 1/2006 | Khedouri et al. | |
| 2006/0026521 A1 | 2/2006 | Hotelling et al. | |
| 2006/0195480 A1 | 8/2006 | Spiegelman et al. | |
| 2006/0225097 A1 | 10/2006 | Lawrence-Apfelbaum | |
| 2007/0038999 A1 | 2/2007 | Millington et al. | |
| 2007/0064954 A1 | 3/2007 | Booth et al. | |
| 2007/0142022 A1 | 6/2007 | Madonna et al. | |
| 2007/0142944 A1 | 6/2007 | Goldberg et al. | |
| 2008/0002839 A1 | 1/2008 | Eng | |
| 2008/0175411 A1 | 7/2008 | Greve | |
| 2009/0047993 A1 | 2/2009 | Vasa | |
| 2009/0063274 A1 | 3/2009 | Dublin, III et al. | |
| 2009/0228919 A1 | 9/2009 | Zott et al. | |
| 2011/0087842 A1 | 4/2011 | Lu et al. | |
| 2011/0234480 A1 | 9/2011 | Fino et al. | |
| 2012/0268145 A1 | 10/2012 | Chandra et al. | |
| 2013/0076651 A1 | 3/2013 | Reimann et al. | |
| 2013/0202131 A1 | 8/2013 | Kemmochi et al. | |
| 2014/0075311 A1 | 3/2014 | Boettcher et al. | |
| 2014/0192986 A1 | 7/2014 | Lee et al. | |
| 2014/0219483 A1 | 8/2014 | Hong | |
| 2014/0363024 A1 | 12/2014 | Apodaca | |

FOREIGN PATENT DOCUMENTS

| | | |
|---|---|---|
| WO | 200153994 | 7/2001 |
| WO | 2003093950 A2 | 11/2003 |
| WO | 2005013047 A2 | 2/2005 |

OTHER PUBLICATIONS

AudioTron Reference Manual, Version 3.0, May 2002, 70 pages.
AudioTron Setup Guide, Version 3.0, May 2002, 38 pages.

(56) References Cited

OTHER PUBLICATIONS

Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003, 33 pages.
MOTOROLA, "Simplefi, Wireless Digital Audio Receiver, Installation and User Guide," Dec. 31, 2001, 111 pages.
Non-Final Office Action dated Feb. 1, 2016, issued in connection with U.S. Appl. No. 14/634,365, filed Feb. 27, 2015, 6 pages.
Non-Final Office Action dated May 5, 2016, issued in connection with U.S. Appl. No. 14/808,923, filed Jul. 24, 2015, 6 pages.
Non-Final Office Action dated Aug. 7, 2018, issued in connection with U.S. Appl. No. 15/954,351, filed Apr. 16, 2018, 7 pages.
Non-Final Office Action dated Sep. 7, 2017, issued in connection with U.S. Appl. No. 15/248,342, filed Aug. 26, 2016, 7 pages.
Notice of Allowance dated May 6, 2016, issued in connection with U.S. Appl. No. 14/634,365, filed Feb. 27, 2015, 9 pages.
Notice of Allowance dated Dec. 13, 2017, issued in connection with U.S. Appl. No. 15/248,342, filed Aug. 26, 2016, 9 pages.
Notice of Allowance dated Jan. 15, 2015, issued in connection with U.S. Appl. No. 13/564,541, filed Aug. 1, 2012, 8 pages.
Notice of Allowance dated Dec. 26, 2018, issued in connection with U.S. Appl. No. 15/954,351, filed Apr. 16, 2018, 9 pages.
Notice of Allowance dated May 27, 2016, issued in connection with U.S. Appl. No. 14/808,923, filed Jul. 24, 2015, 8 pages.
Palm, Inc., "Handbook for the Palm VII Handheld," May 2000, 311 pages.
Polycom Conference Composer User Guide, copyright 2001, 29 pages.
Presentations at WinHEC 2000, May 2000, 138 pages.
PRISMIQ, Inc., "PRISMIQ Media Player User Guide," 2003, 44 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 32 manual: copyright 2001, 296 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

VOLUME INTERACTIONS FOR CONNECTED PLAYBACK DEVICES

CROSS REFERENCE TO RELATED APPLICATIONS

This application is a continuation of U.S. non-provisional patent application Ser. No. 15/954,351, filed on Apr. 16, 2018, entitled "Volume Interactions for Connected Subwoofer Device," which is incorporated herein by reference in its entirety. U.S. non-provisional patent application Ser. No. 15/954,351 is a continuation of U.S. non-provisional patent application Ser. No. 15/248,342, filed on Aug. 26, 2016, entitled "Volume Interactions for Connected Playback Devices," and issued as U.S. Pat. No. 9,948,258, which is also incorporated herein by reference in its entirety. U.S. non-provisional patent application Ser. No. 15/248,342 is a continuation of U.S. non-provisional patent application Ser. No. 14/808,923, filed on Jul. 24, 2015, entitled "Volume Interactions for Connected Playback Devices," and issued as U.S. Pat. No. 9,455,679, which is also incorporated herein by reference in its entirety. U.S. non-provisional patent application Ser. No. 14/808,923 is a continuation of U.S. non-provisional patent application Ser. No. 14/634,365, filed on Feb. 27, 2015, entitled "Volume Interactions for Connected Playback Devices," and issued as U.S. Pat. No. 9,379,683, which is also incorporated herein by reference in its entirety. U.S. non-provisional patent application Ser. No. 14/634,365 is a continuation of U.S. non-provisional patent application Ser. No. 13/564,541, filed on Aug. 1, 2012, entitled "Volume Interactions for Connected Playback Devices," and issued as U.S. Pat. No. 8,995,687, which is also incorporated herein by reference in its entirety.

FIELD OF THE DISCLOSURE

The disclosure is related to consumer goods and, more particularly, to systems, products, features, services, and other items directed to media playback or some aspect thereof.

BACKGROUND

Listening to audio content out loud can be a social activity that involves family, friends, or both. Audio content may include, for instance, music, talk radio, books, audio from television, and other audible material. For example, in a household, people may play music out loud at parties and other social gatherings. In such an environment, people may wish to play the music in one listening zone or multiple listening zones simultaneously, such that the music in each listening zone may be synchronized, without audible echoes or glitches. Such an experience may be further enriched when people, for example, browse audio sources, add a music track to a playback queue, learn more about a music track (such as track title or track artists), or view what music track is next in the playback queue.

Listening to audio can also be an individual experience. For example, an individual may play music for themselves in the morning before work, in the evening during dinner, or at other times throughout the day at home, work, or on the road. In a household or shared environment, individuals may want to play different music in different listening zones at the same time. For these individual experiences, the individual may choose to either use headphones or limit the out loud playback of audio content to a single zone or area.

Whether an audio experience is social or individual, technological advancements have increased the accessibility of music content, as well as other types of media, such as television content, movies, and interactive content. For example, a user can access audio, video, or both audio and video content over the Internet through an online store, an Internet radio station, a music service, a movie service, and so on, in addition to the more traditional avenues of accessing audio and video content. Demand for audio, video, and both audio and video content inside and outside of the home continues to increase.

BRIEF DESCRIPTION OF THE DRAWINGS

Features, aspects, and advantages of the presently disclosed technology are better understood with regard to the following description, appended claims, and accompanying drawings where:

Figure 1:
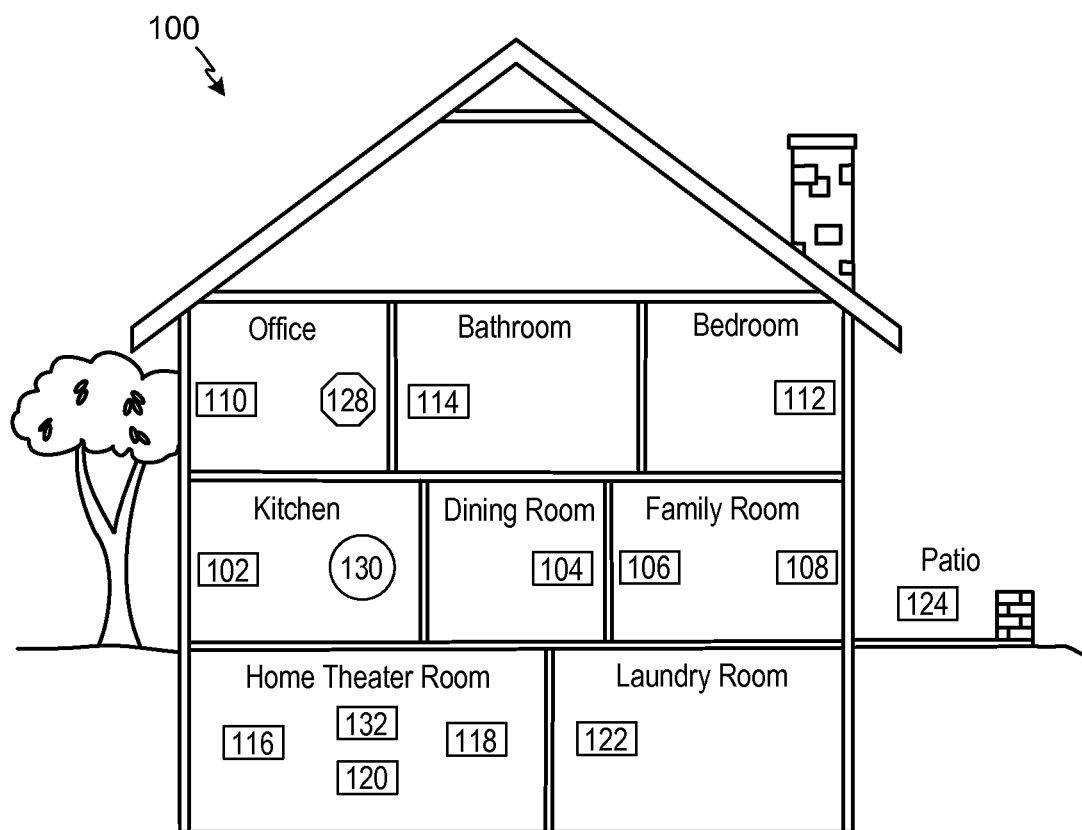
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

In the present application, methods and systems are provided for offering a unique wired, wireless, or both wired and wireless audio solution that allows music, or other audio content of any kind, to be played in a single listening zone or across multiple listening zones simultaneously and in synchrony. The audio content may be played out loud or using headphones, for example. The system may include audio players, often referred to as zone players or players, and controllers, which also might be a player. Controllers can be instantiated in many forms, including, for example, dedicated audio controllers or applications on computers or portable/mobile devices. One or more controllers may be used to control the system, including browsing and selecting audio for playback, viewing and editing audio in the one or more play queues, grouping and ungrouping zone players into one or more listening zones, increasing or decreasing the volume of the players or group of players, etc. In general, the system may operate as a distributed system where each controller has full control over the entire system, and each player has the ability to play a different audio source or the same audio source as another player.

In a shared environment where multiple controllers can control and configure multiple players dynamically, control access of the system may be limited or otherwise restricted according to system permissions, preferences, etc., set by default, by owner, and so on. In certain embodiments, limited user access may apply restrictions on an entire media playback system, a single listening zone, and/or a listening zone group. In some example embodiments, limited user access may include restricting volume control in certain specified listening zones and/or zone groups. In another example embodiment, limited user access may include restricting volume control for a fixed time interval, during a particular time-of-day, and/or on a recurring basis.

In one aspect, a method is provided. The method may involve applying a state variable update associated with a first playback device in a plurality of playback devices. The state variable update may indicate a limited volume range associated with the first playback device. The method may further involve causing the plurality of playback devices to render audio content in synchrony, receiving input data indicating a group volume adjustment for the plurality of playback devices, and causing a playback volume of the first playback device to be adjusted based on the group volume adjustment and the limited volume range.

In another aspect a system including a plurality of playback devices and a processor is provided. The processor may b e configured to execute instructions for applying a state variable update associated with a first playback device in the plurality of playback devices. The state variable update may indicate a limited volume range associated with the first playback device. The processor may further be configured to execute instructions for causing the plurality of playback devices to render audio content in synchrony, receiving input data indicating a group volume adjustment for the plurality of playback devices, and causing a playback volume of the first playback device to be adjusted based on the group volume adjustment and the limited volume range.

In a further aspect, a non-transitory computer readable medium is provided. The computer-readable medium has instructions stored thereon executable by a computing device to cause the computing device to perform functions involving applying a state variable update associated with a first playback device in a plurality of playback devices. The state variable update may indicate a limited volume range associated with the first playback device. The instructions may further cause the computing device to perform functions involving causing the plurality of playback devices to render audio content in synchrony, receiving input data indicating a group volume adjustment for the plurality of playback devices, and causing a playback volume of the first playback device to be adjusted based on the group volume adjustment and the limited volume range.

II. An Example Operating Environment

Referring now to the drawings, in which like numerals can refer to like parts throughout the figures, FIG. 1 shows an example system configuration 100 in which one or more embodiments disclosed herein can be practiced or implemented.

By way of illustration, the system configuration 100 represents a home with multiple zones, though the home could have been configured with only one zone. Each zone, for example, may represent a different room or space, such as an office, bathroom, bedroom, kitchen, dining room, family room, home theater room, utility or laundry room, and patio. A single zone might also include multiple rooms or spaces if so configured. One or more of zone players 102-124 are shown in each respective zone. A zone player 102-124, also referred to as a playback device, multimedia unit, speaker, player, and so on, provides audio, video, and/or audiovisual output. A controller 130 (e.g., shown in the kitchen for purposes of illustration) provides control to the system configuration 100. Controller 130 may be fixed to a zone, or alternatively, mobile such that it can be moved about the zones. System configuration! 100 may also include more than one controller 130. The system configuration 100 illustrates an example whole house audio system, though it is understood that the technology described herein is not limited to its particular place of application or to an expansive system like a whole house audio system 100 of FIG. 1.

a. Example Zone Players

Figure 2A:
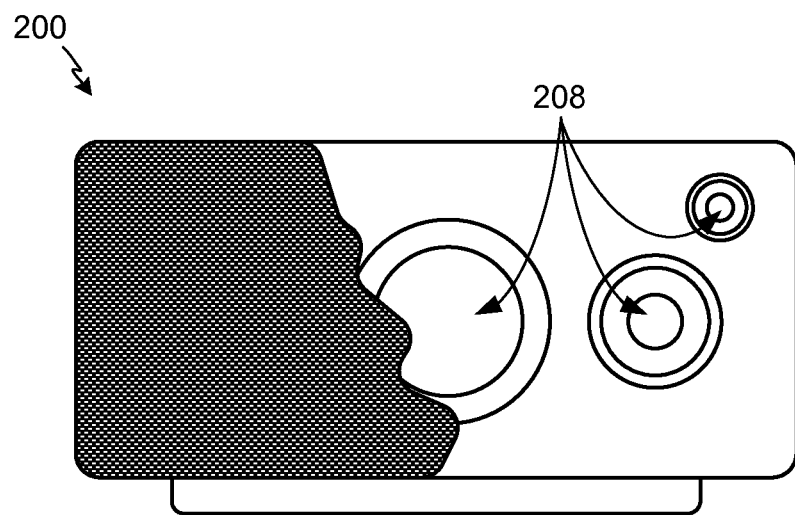
FIG. 2A shows an illustration of an example zone player having a built-in amplifier and speakers.
Figure 2B:
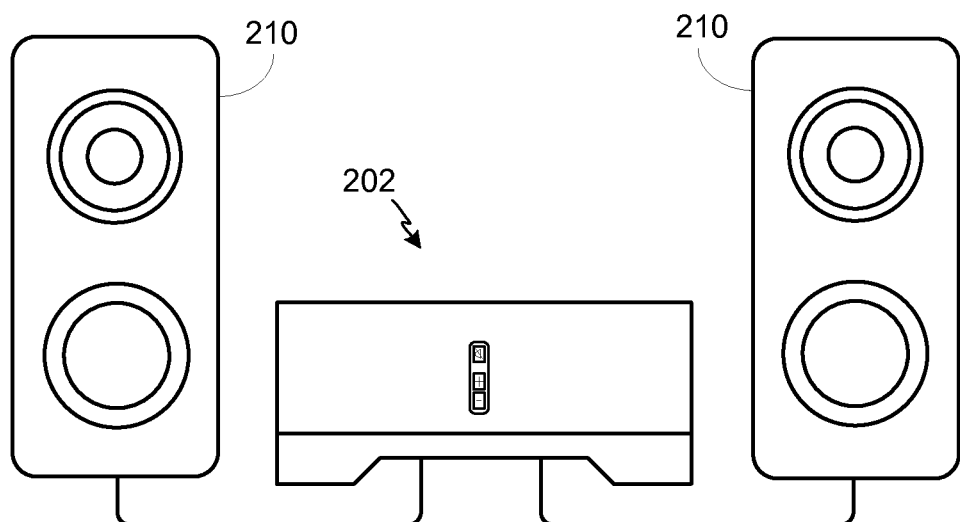
FIG. 2B shows an illustration of an example zone player having a built-in amplifier and connected to external speakers.
Figure 2C:
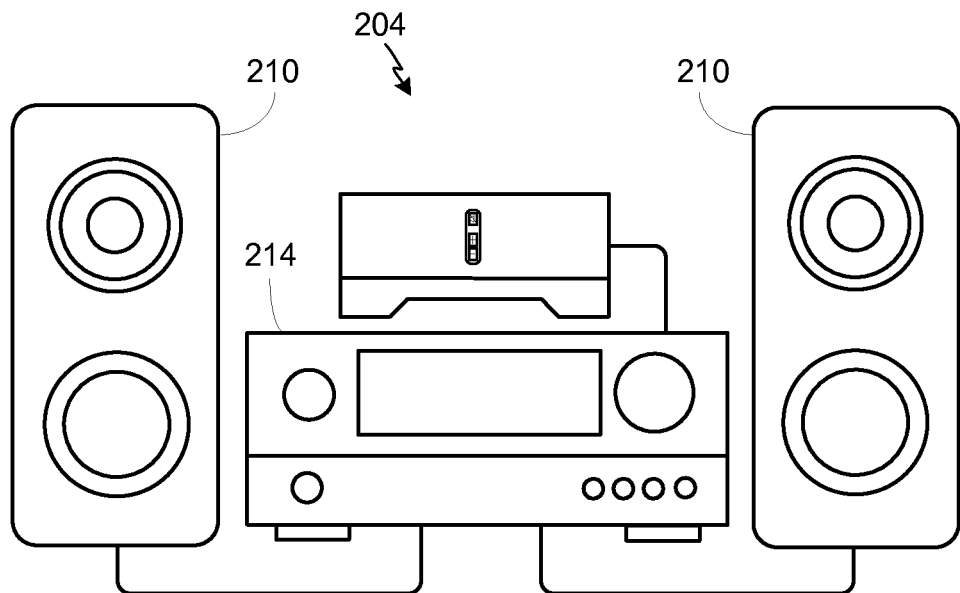
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more speakers. A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 is configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a zone player may contain a playlist or queue of audio items to be played (also referred to herein as a "playback queue"). Each item in the queue may comprise a uniform resource identifier (URI) or some other identifier. The URI or identifier can point the zone player to the audio source. The source might be found on the Internet (e.g., the cloud), locally from another device over data network 128 (described further below), from the controller 130, stored on the zone player itself, or from an audio source communicating directly to the zone player. In some embodiments, the zone player can reproduce the audio itself, send it to another zone player for reproduction, or both where the audio is played by the zone player and one or more additional zone players in synchrony. In some embodiments, the zone player can play a first audio content (or not play at all), while sending a second, different audio content to another zone player(s) for reproduction.

By way of illustration, SONOS, Inc. of Santa Barbara, Calif. presently offers for sale zone players referred to as a "PLAY:5," "PLAY:3," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player can include or interact with a docking station for an Apple IPOD™ or similar device.

b. Example Controllers

Figure 3:
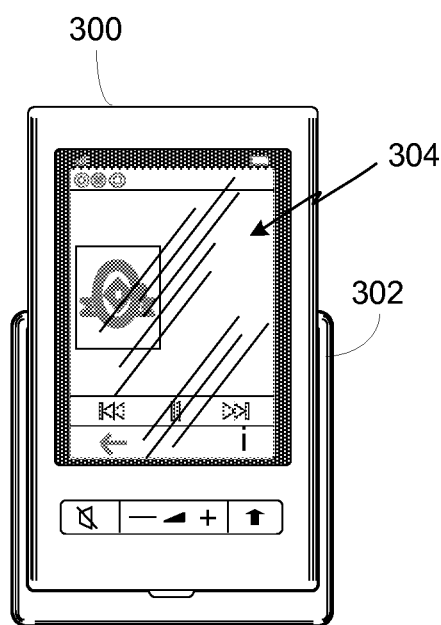
FIG. 3 shows an illustration of an example controller.

FIG. 3 illustrates an example wireless controller 300 in docking station 302. By way of illustration, controller 300 can correspond to controlling device 130 of FIG. 1. Docking station 302, if provided, may be used to charge a battery of controller 300. In some embodiments, controller 300 is provided with a touch screen 304 that allows a user to interact through touch with the controller 300, for example, to retrieve and navigate a playlist of audio items, control operations of one or more zone players, and provide overall control of the system configuration 100. In certain embodiments, any number of controllers can be used to control the system configuration 100. In some embodiments, there can be a limit set on the number of controllers that can control the system configuration 100. The controllers might be wireless like wireless controller 300 or wired to data network 128.

In some embodiments, if more than one controller is used in system 100, then each controller may be coordinated to display common content, and may all be dynamically updated to indicate changes made from a single controller. Coordination can occur, for instance, by a controller periodically requesting a state variable directly or indirectly from one or more zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an IPHONE™, IPAD™, ANDROID™ powered phone, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by Sonos, Inc. of Santa Barbara, Calif. include a "Controller 200," "SONOS® CONTROL," "SONOS® Controller for IPHONE™," "SONOS® Controller for IPAD™," "SONOS® Controller for ANDROID™," "SONOS® Controller for MAC™ or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players 102-124 are wirelessly coupled to data network 128 using a non-mesh topology. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, music on a zone player itself may be accessed and played. In some embodiments, music from a personal library stored on a computer or networked-attached storage (NAS) may be accessed via the data network 128 and played. In some embodiments, Internet radio stations, shows, and podcasts can be accessed via the data network 128. Music or cloud services that let a user stream and/or download music and audio content can be accessed via the data network 128. Further, music can be obtained from traditional sources, such as a turntable or CD player, via a line-in connection to a zone player, for example. Audio content can also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

II. Example Zone Players

Figure 4:
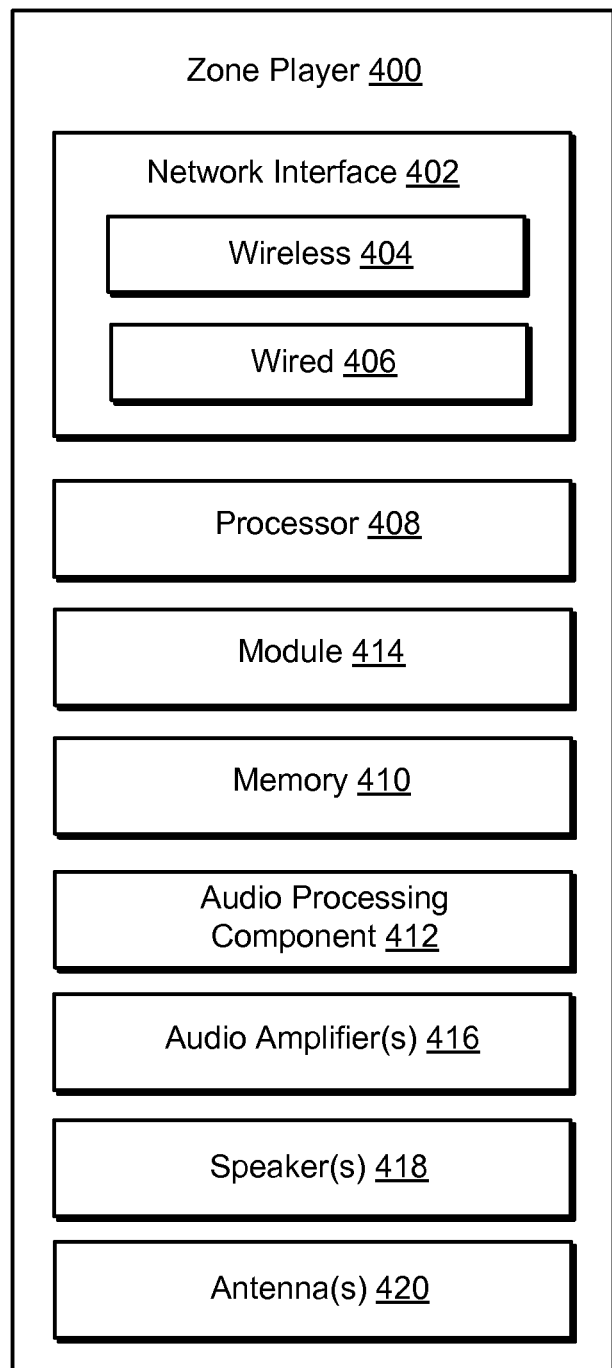
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, or 802.15). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5, is a zone player with a built-in amplifier and speakers that is capable of retrieving audio directly from the source, such as on the Internet or on the local network, for example. In particular, the PLAY:5 is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5.

IV. Example Controller

Figure 5:
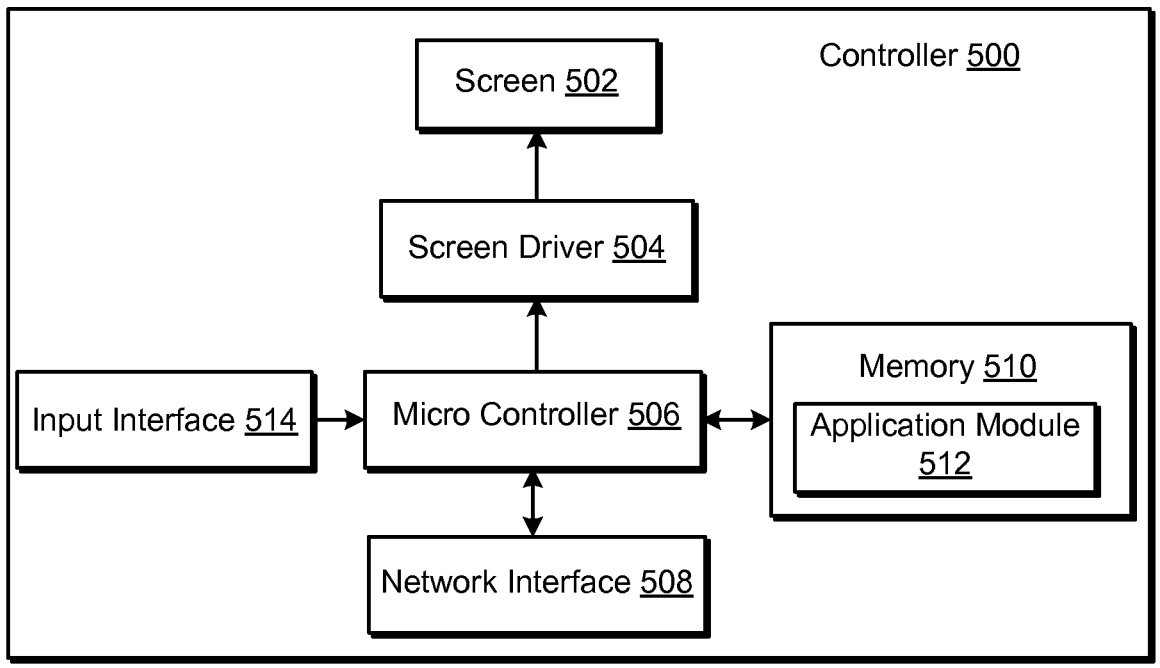
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.15, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE®, IPAD® or any other smart phone or network-enabled device (e.g., a networked computer such as a PC or MAC®) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Example Ad-Hoc Network

Figure 6:
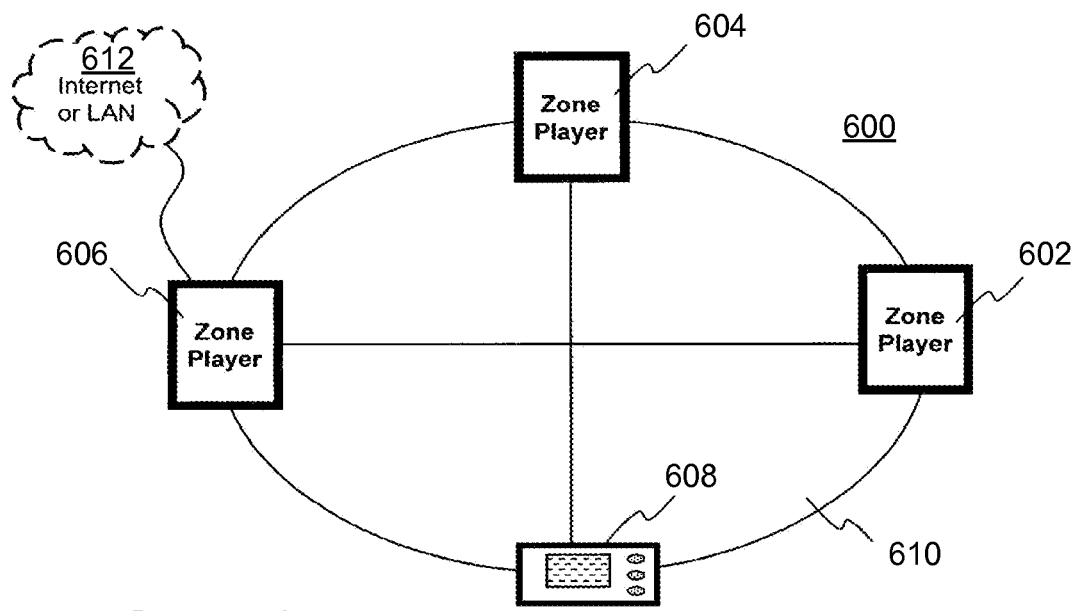
FIG. 6 shows an example ad-hoc playback network.

Certain particular examples are now provided in connection with FIG. 6 to describe, for purposes of illustration, certain systems and methods to provide and facilitate connection to a playback network. FIG. 6 shows that there are three zone players 602, 604 and 606 and a controller 608 that form a network branch that is also referred to as an Ad-Hoc network 610. The network 610 may be wireless, wired, or a combination of wired and wireless. In general, an Ad-Hoc (or "spontaneous") network is a local area network or other small network in which there is generally no one access point for all traffic. With an established Ad-Hoc network 610, the devices 602, 604, 606 and 608 can all communicate with each other in a "peer-to-peer" style of communication, for example. Furthermore, devices may come/and go from the network 610, and the network 610 will automatically reconfigure itself without needing the user to reconfigure the network 610. While an Ad-Hoc network is referenced in FIG. 6, it is understood that a playback network may be based on a type of network that is completely or partially different from an Ad-Hoc network.

Using the Ad-Hoc network 610, the devices 602, 604, 606, and 608 can share or exchange one or more audio sources and be dynamically grouped to play the same or different audio sources. For example, the devices 602 and 604 are grouped to playback one piece of music, and at the same time, the device 606 plays back another piece of music. In other words, the devices 602, 604, 606 and 608, as shown in FIG. 6, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 610 (or household identifier), though a HOUSEHOLD may be identified with a different area or place.

In certain embodiments, a household identifier (HHID) is a short string or an identifier that is computer-generated to help ensure that it is unique. Accordingly, the network 610 can be characterized by a unique HHID and a unique set of configuration variables or parameters, such as channels (e.g., respective frequency bands), SSID (a sequence of alphanumeric characters as a name of a wireless network), and WEP keys (wired equivalent privacy or other security keys). In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., WEP keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 606 in FIG. 6 is shown to be connected to both networks, for example. The connectivity to the network 612 is based on Ethernet and/or Wireless, while the connectivity to other devices 602, 604 and 608 is based on Wireless and Ethernet if so desired.

It is understood, however, that in some embodiments each zone player 606, 604, 602 may access the Internet when retrieving media from the cloud (e.g., Internet) via the bridging device. For example, zone player 602 may contain a uniform resource locator (URL) that specifies an address to a particular audio track in the cloud. Using the URL, the zone player 602 may retrieve the audio track from the cloud, and ultimately play the audio out of one or more zone players.

VI. Example System Configuration

Figure 7:
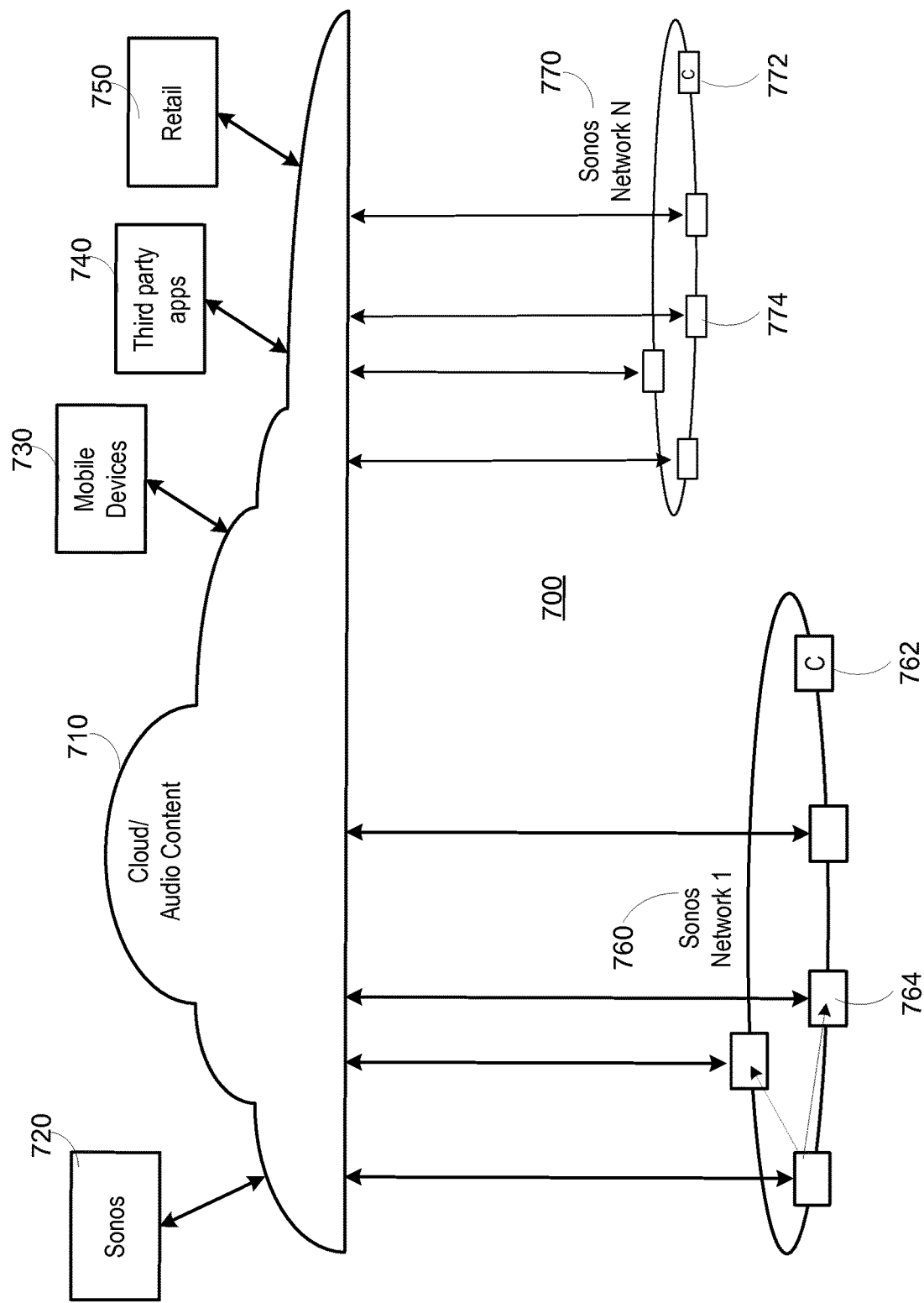
FIG. 7 shows a system including a plurality of networks including a cloud-based network and at least one local playback network.

FIG. 7 shows a system including a plurality of networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 700 of FIG. 7, a plurality of content providers 720-750 can be connected to one or more local playback networks 760-770 via a cloud and/or other network 710. Using the cloud 710, a multimedia playback system 720 (e.g., Sonos™), a mobile device 730, a third party application 740, a content provider 750 and so on can provide multimedia content (requested or otherwise) to local playback networks 760, 770. Within each local playback network 760, 770, a controller 762, 772 and a playback device 764, 774 can be used to playback audio content.

VII. Example Method for Volume Interactions of Connected Players

As discussed above, in a shared environment where multiple controllers can control and configure multiple players dynamically, user access restrictions for an entire media playback system, a single listening zone, and/or a listening zone group may be applied. For example, control of the volume or volume ranges of the playback system, listening zone, and/or listening zone group, may be restricted to specific users, specific controllers, or specific devices in the system.

As shown in FIG. 1, an example system may include multiple playback devices and one or more controllers connected together in a local area network (LAN). In such a configuration, volume limits for certain playback devices or groups of playback devices during individual or group volume adjustments may be implemented. In one example, if a group of players includes a player that is playing audio over headphones, a maximum player volume may be implemented such that the playback volume of the player may be individually limited when a group playback volume for the group of players is being adjusted. In another example, a maximum group volume may be implemented such that the group playback volume for the group of players may be limited at certain times of the day. For instance, the group playback volume for a group of players in the patio listening zone, for example, may be limited between the hours of 9:30 pm and 7:00 am so as not to disturb neighbors. In the following discussions, and as applicable to earlier discussions, the phrase "group volume" may refer generally to a collective volume level of players in a defined group. For instance, the group volume of a group of players may be defined as an average of respective volumes for each player in the group of players.

Figure 8B:
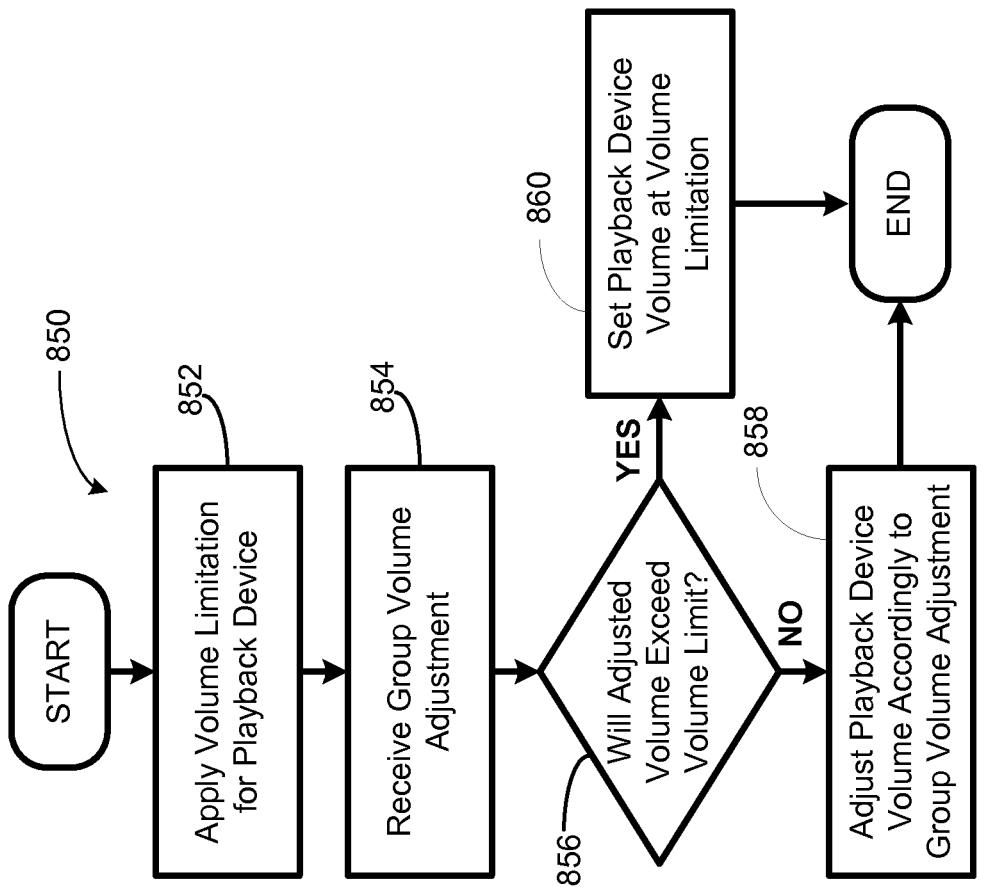
FIG. 8B shows an illustrative flow-chart for a second example method for volume interactions with a zone player.
Figure 8A:
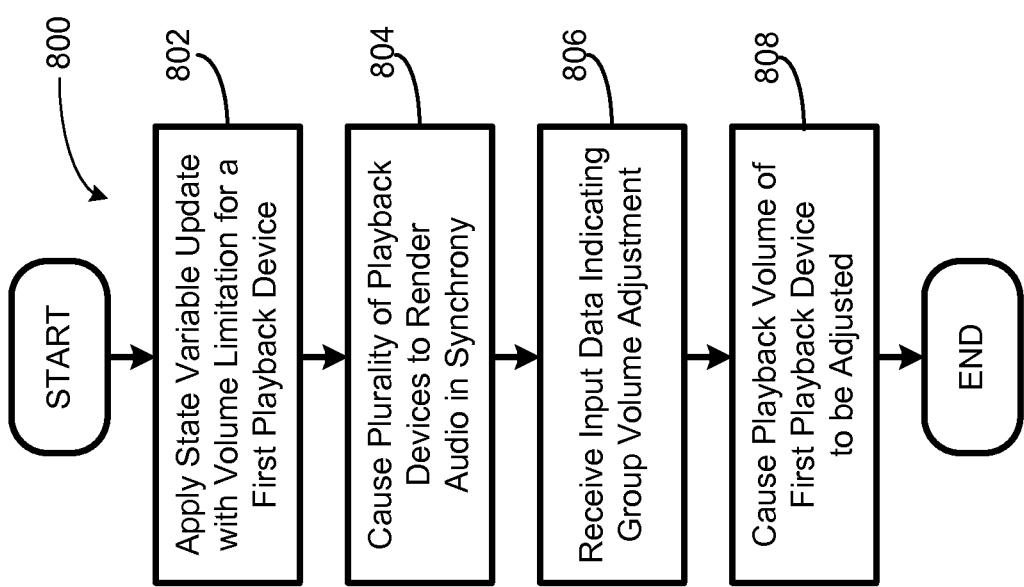
FIG. 8A shows an illustrative flow-chart for a first example method for volume interactions with a zone player.

FIG. 8A shows an illustrative flow-chart for a first example method 800 for volume interactions with a zone player, in accordance with at least some embodiments described herein. Method 800 shown in FIG. 8A presents an embodiment of a method that could be used in the environment 100 with the systems 200, 202, 204, 300, 400, and 500 for example, in communication with a device, such as devices illustrated in FIGS. 2-5, components of the devices, or a calibration device described in a following section. Method 800 may include one or more operations, functions, or actions as illustrated by one or more of blocks 802-808. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

In addition, for the method 800 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 800 and other processes and methods disclosed herein, each block in FIG. 8A may represent circuitry that is wired to perform the specific logical functions in the process.

At block 802, the method 800 involves applying a state variable update associated with a first playback device in a plurality of playback devices. As mentioned above, capabilities or functionalities of a player may be represented by a state variable associated with the player. The state variable may be stored on the respective player or on a network, such as the cloud 710 of FIG. 7 discussed above. Further, the state variable may be updated regularly, as the capabilities and the functionalities of the player may change dynamically over time.

In one example, the state variable update may indicate volume ranges associated with the first playback device, including a device volume range and a limited volume range. The device volume range may define the range of volumes the playback device is specified for as designed by the manufacturer, for example. The limited volume range may define a range of volume within the range of the device volume range, and may be determined by a user of the playback device. For instance, if a player is located in an enclosed room smaller than an area the particular player was designed to render music in, the maximum playback volume of the player may be limited to for example, 8 out of 10 to maintain optimal clarity when rendering audio content in the smaller room. In this case, the limited volume range may provide a "cap" on the playback volume. In other cases, the volume range may also provide a "floor" on the playback volume, thus indicating a minimum playback volume.

In another example, the state variable update may further indicate one or more time frames associated with the limited volume range. For instance, as suggested previously, a limited volume range may be applied between certain hours of the day to avoid disturbing neighbors. In one case, the limited volume range may be implemented for an entire system and applied to the group volume. In another case, the limited volume range may be implemented for subgroups of playback devices in the system and applied to the respective device volumes. Further, different limited volume ranges may be implemented for different playback devices during different time frames as well. As illustrated previously, the group playback volume for a group of players in the patio listening zone, for example, may be limited between the hours of 9:30 pm and 7:00 am so as not to disturb neighbors.

In a further example, the state variable update may indicate one or more play modes of the first playback device associate with the limited volume range. For instance, the player may have a "regular mode" for regular playback through attached speakers and a "headphone mode" for playback through headphones, such that different playback equalization and maximum volume limits may be implemented for each play mode. In one case, the system may be configured to limit the maximum volume to be 7 out of 10 when in headphone mode. In another case, continuing with the previous example of limiting the volume of the players in the patio listening zone between certain hours, the system may be configured to reset the maximum volume of the patio listening zone to be 10 out of 10 if headphones are present, even if the time is within the 9:30 pm to 7:00 am time frame.

In either case, a state variable (e.g. GetHeadphoneConnected, for example) may indicate the presence or absence of an attached headphone. In this case, the player may include an automatic headphone detection mechanism to determine whether a headphone is present or absent, and subsequently update the state variable to indicate the presence or absence of headphones. In other words, as a headphone is attached or removed from the player, the state variable GetHeadphoneConnected may be dynamically updated, and the play mode of the player may be modified according to the state variable. In a further example, the state variable may further indicate information on the attached headphone, and the limited volume range may be determined based on the information on the attached headphone.

Referring back to block 802, applying the state variable update associated with the first playback device in the plurality of playback devices may further involve determining a validity of the state variable update, and applying the state variable update based on the validity of the state variable. In this case, determining the validity of the state variable update may further involve determining a source of the state variable update, For example, the modification of certain state variables, such as that of a volume limit, may be restricted to certain controllers such that the certain state variables may be updated by accessing the certain controllers. In another example, modification of the certain variables may be restricted to accessing a playback device directly. In other words, a user may be required to physically and manually access the playback device to adjust certain settings, thereby updating the certain state variables. In one case, updating certain stale variables may require a combination of both accessing certain controllers and accessing the playback device directly.

In a further example, the modification of certain state variables may be restricted to specific users. In this case, determining the validity of the state variable update may involve sending a request for an indication of qualification, receiving an indication of qualification, and determining the validity of the state variable update based on the indication of qualification. In other words, when a user wishes to modify a certain state variable, the system may prompt the user for a passcode to indicate qualifications of the user, and determine whether to apply the state variable update based on the indicated qualifications. In one case, the qualifications may be associated with a user account, which the user may access when controlling the system of playback devices. In another case, the qualifications may be associated with a passcode, such that users having separate user accounts may qualify to modify certain state variables based on the passcode.

At block 804, the method 800 involves causing the plurality of playback devices to render audio content in synchrony. As previously discussed, a user may listen to audio content using one or more players having the capabilities to be grouped together and render audio content in a synchronized fashion such that each of the players render audio content from an (e.g., identical) audio source or a list of audio sources in a synchronized manner such that no (or substantially no) audible delays or echoes can be heard. Examples of grouped players may include a zone group (when two or more zones are grouped), zone scenes (when a zone or zone group is formed based upon a trigger), bonded zone (often further distinguished as a zone having two or more players, a "paired player," or "consolidated player"), and so on. In certain embodiments, players can be grouped and ungrouped dynamically, through a control interface via as a wireless controller, for example. Grouped players can be further be grouped with other players and/or zone groups to create yet another (i.e., nested) group of players.

As discussed above, a state variable associated with a player may indicate capabilities or functionalities. In one example, the state variable may indicate zone group affiliations of the player. In one case, the state variable may further indicate zone capabilities or functionalities of the zone group, and/or each of the players in the zone group. For instance, for a "Home Theater" zone group with players configured to render audio content as a unified 5.1 system, the state variable associated with one of the players in the zone group may indicate playback responsibilities of the respective player, as well as playback responsibilities for each of the other players in the zone group.

At block 806, the method 800 involves receiving input data indicating a group volume adjustment tor the plurality of playback devices. The group volume adjustment may be either an increase in group volume or a decrease in group volume. Further, the group volume adjustment may indicate a substantially uniform volume adjustment for each player in the respective group.

In one example, a user interface display may be provided to inform the user of any play modes or volume limitations that may affect the user's adjustment of the volume. For instance, a first volume scale representing the limited volume range relative to a device volume range associated with the first playback device may be provided. In one case, the user interface may be provided to the user when the user wishes to adjust a volume for one or more players via a controller, for example. In this case, the controller accessed by the user may retrieve state variables indicating functionalities and capabilities of one or more players, as discussed previously. The controller may then display information for the one or more players on a display screen of the controller. Examples of displayed volume scales with limited volume ranges for different players or listening zones are provided and discussed below in connection to FIGS. 9A and 9B.

Further in this case, the input data indicating the group volume adjustment may be received in a variety of different ways. For instance, if the controller included a touchscreen interface, the user may provide the group volume adjustment input by dragging a volume indicator along the one or more volume scales to adjust the volume. In another instance, if the controller has physical volume adjustment buttons (either individual buttons or rocker buttons, for example), then the system may be configured to receive the input data via the volume adjustment buttons.

Referring back to FIG. 8A, at block 808, the method 800 involves causing a playback volume of the first playback device to be adjusted based on the group volume adjustment and the limited volume range. In one example, the group volume adjustment may involve the playback volume of the first playback device to be adjusted to a volume level within the limited volume range. In this case, the playback volume of the first playback device may be adjusted according to group volume adjustment. In another example, the group volume adjustment may involve the playback volume of the first playback device to be adjusted to a volume level beyond the limited volume range. In this case, the playback volume of the first playback device may be adjusted to the maximum volume level of the limited volume range. In other words, the adjustment of the playback volume of the first playback device may be "capped" at the maximum volume level of the limited volume range. An example implementation of block 808 is further discussed below in connection to FIG. 8B.

FIG. 8B shows an illustrative flow-chart for a second example method 850 for volume interactions with a zone player, in accordance with at least some embodiments described herein. As shown, method 850 presents an embodiment of a method that could be used in the environment 100 with the systems 200, 202, 204, 300, 400, and 500, for example. Method 850 may include one or more operations, functions, or actions as illustrated by one or more of blocks 852-860. Although the blocks are illustrated in a sequential order, these blocks may also be performed in parallel, and/or in a different order than those described herein. Also, the various blocks may be combined into fewer blocks, divided into additional blocks, and/or removed based upon the desired implementation. As shown, blocks 852, 854, 858, and 860 are action blocks, and block 856 is a decision block.

At action block 852, the method 850 involves applying a volume limitation tor a playback device, and at action block 854, the method 850 involves receiving a group volume adjustment In one example, action block 852 may be implemented substantially the same as block 802 of the method 800 shown in FIG. 8A, and action block 854 may be implemented substantially the same way as block 806 of the method 800 shown in FIG. 8A. Accordingly, decision block 856, and action blocks 858 and 860 may be implemented as block 808 of the method 800 shown in FIG. 8A.

At decision block 856, the method 850 involves determining whether the group volume adjustment, as applied to the playback device will result in the playback volume of the device exceeding the volume limitation for the playback device. If at decision block 856, a determination is made that applying the group volume adjustment to the playback device will not result in the playback volume of the playback device exceeding the volume limitation of the playback device, the method 850 may then proceed to action block 858, which may involve adjusting the playback volume of the playback device according to the group volume adjustment.

On the other hand, if at decision block 856, a determination is made that applying the group volume adjustment to the playback device will result in the playback volume of the device exceeding the volume limitation of the playback device, the method 850 may then proceed to action block 860, which may involve adjusting the playback volume of the playback device to the maximum volume level within the volume limitation for the playback device.

As previously discussed, the group volume adjustment may involve an increase in group volume or a decrease in group volume. In practice, in the case the group volume adjustment involves an increase in group volume from a volume level below the volume limitation of the playback device, the playback volume of the playback device may be increased up until the maximum volume level within the volume limitation for the playback device. In the case the group volume adjustment involves a decrease in group volume from a volume above the volume limitation for the playback device, the playback volume of the playback device may remain at the maximum volume level within the volume limitation for the playback device until the group volume is decreased to a level below the maximum volume level.

VIII. Example User Interface for Volume Interactions of Connected Players

Figure 9A:
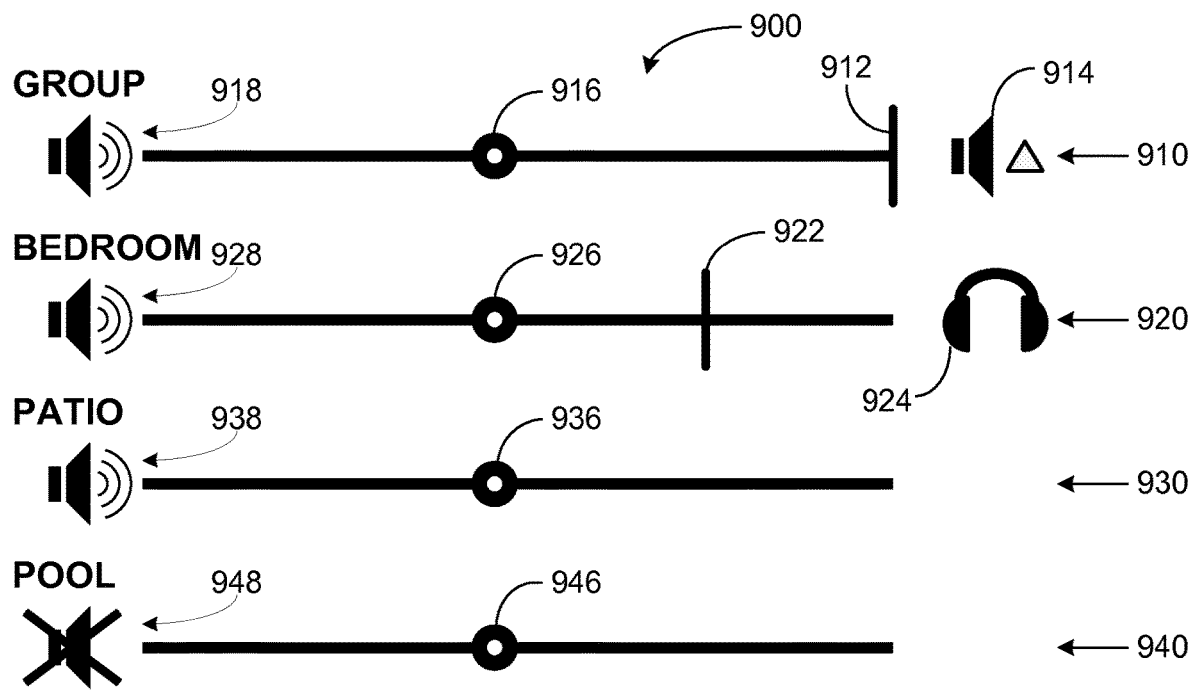
FIG. 9A shows an illustrative first view of a user interface for volume interactions with zone players.

As discussed previously, a user interface may be provided when a user wishes to adjust a volume for one or more players. In particular, a graphical display may be provided to inform the user of playback capabilities and functionalities of the player as well as any play modes or volume limitations that may affect the user's adjustment of the volume. FIG. 9A shows an illustrative first view of a user interface 900 for volume interactions with zone players. In one example, the user interface 900 may be provided on a display on a controller by which the user may be adjusting the volume. In one case, the information displayed on the user interface 900 may be based on state variables retrieved from each associated player directly, or from a cloud network, as mentioned previously. In this case, updated state variables for each associated player may be retrieved each time a state variable has been updated.

As illustrated, the user interface 900 includes a group volume scale 910, a bedroom volume scale 920, a patio volume scale 930, and a pool volume scale 940. The bedroom volume scale 920 indicates the volume range for the one or more players in a bedroom listening zone, the patio volume scale 930 indicates the volume range for the one or more players in a patio listening zone, and the pool volume scale 940 indicates the volume range for the one or more players in a pool listening zone. In this case, the group volume scale 910 may represent the volume range for the bedroom listening zone, the patio listening zone, and the pool listening zone as a collective group.

As shown, the group volume scale 910 may include a maximum volume indicator 912 representing a volume limit of the group of listening zones, a group status indicator 914 representing a group status of the group of listening zones, a volume indicator 916 representing a volume level of the group of listening zones, and a playback status indicator 918 representing whether playback within the group of listening zones is normal or muted. In this case, the group status indicator 914 may indicate that a volume of the group is being adjusted upward, and the playback status indicator 918 may indicate that the playback of the group is normal (i.e. not muted).

Also as shown, the bedroom volume scale 920 may include a maximum volume indicator 922 representing a volume limit of the bedroom listening zone, a status indicator 924 representing a status of the bedroom listening zone, a volume indicator 926 representing a volume level of the bedroom zone, and a playback status indicator 928 representing whether playback within the bedroom listening zone is normal or muted. In this case, the status indicator 924 may indicate that a headphone is plugged into a player in the bedroom listening zone and the bedroom listening zone is therefore in a headphone mode. The status indicator 924 may be removed or modified if and when the headphone is removed. Further, the maximum volume indicator 922 may indicate a volume limit lower than the maximum volume capability of players in the bedroom listening zone. This may be a result of the bedroom listening zone being in headphone mode, for example.

Further as shown, the patio volume scale 930 may also include a volume indicator 936 representing a volume level of the patio listening zone, which may be consistent with the volume level of the group, and a playback status indicator 938 representing that playback within the patio listening zone is, for example, normal. Further, the pool patio volume scale 940 may include a volume indicator 946 representing a volume level of the pool listening zone, which may be consistent with the volume level of the group, and a playback status indicator 948 representing that playback in the pool listening zone is, for example, muted. In such a case, the volume indicator 946 may still be provided such that the user may be aware of the volume of playback in the pool listening zone if the user wishes to unmute playback in the pool listening zone. In another case, the pool listening zone may be inactive because the pool is closed. In this case, a group status indicator (not shown) may be provided to indicate that the pool listening zone is inactive.

As discussed previously, a group volume of a group of players may be defined as an average of respective volumes for each player in the group of players. As such, while volume indicators 916, 926, 936, and 946 of FIG. 9A may appear to indicate that audio playback in the bedroom listening zone, the patio listening zone, and the pool listening zone are at a same volume level, other embodiments may involve different respective playback volumes in the different listening zone. In such embodiments, a corresponding group volume may be calculated as an average of the respective playback volumes.

Figure 9B:
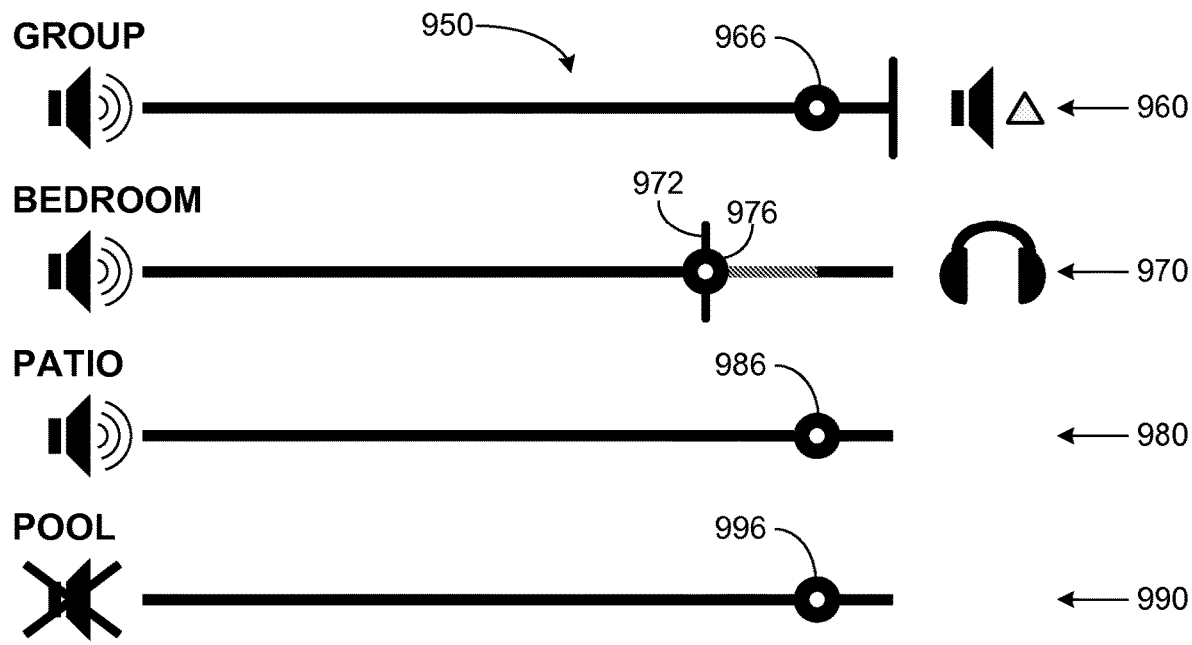
FIG. 9B shows an illustrative second view of a user interface for volume interactions with zone players.

FIG. 9B shows an illustrative second view of a user interface 950 for volume interactions with zone players. In one example, the second view of the user interface 950 may be a subsequent view of the user interface 900 shown in FIG. 9A, after a group volume adjustment has been applied. As illustrated, the user interface 950 includes a group volume scale 960, a bedroom volume scale 970, a patio volume scale 980, and a pool volume scale 990. The bedroom volume scale 970 indicates the volume range for the one or more players in a bedroom listening zone, the patio volume scale 980 indicates the volume range for the one or more players in a patio listening zone, and the pool volume scale 990 indicates the volume range for the one or more players in a pool listening zone. Similar to group volume scale 910 of FIG. 9A, the group volume scale 960 may represent the volume range for the bedroom listening zone, the patio listening zone, and the pool listening zone as a collective group.

As shown, each of the volume scales 960, 970, 980, and 990 have associated volume indicators 966, 976, 986, and 996, respectively" In this case, the group volume indicator 966 may indicate that the group volume has been increased, and the respective playback volumes in the patio listening zone and the pool listening zone have increased accordingly as represented by volume indicators the 986 and 996, respectively.

On the other hand, the volume indicator 976 may represent a playback volume in the bedroom listening zone capped by the volume limitation as represented by a maximum volume indicator 972, similar to the maximum volume indicator 922 of FIG. 9A. In other words, the group volume adjustment may not have been fully applied to the bedroom listening zone, but rather, the volume adjustment may have only been applied as much as is al !owed by the volume limitation as represented by the maximum volume indicator 972.

In one example, a user may be adjusting the bedroom listening zone playback volume via a touch screen interface by dragging the volume indicator 976 along the volume scale 970. In one case, the volume indicator may stop at the maximum volume indicator 972 as the user drags past the maximum volume indicator. In another case, as shown, a section of the volume scale 970 may change color as the user drags the group volume indicator 966 beyond the maximum volume indicator 972 for the bedroom listening zone, indicating a volume difference between the adjusted group volume and the maximum volume of the bedroom listening zone.

In another example, a notification may be provided on the user interface 950 to inform the user when a maximum volume limit has been reached, or that a certain player or listening zone did not fully apply the group volume adjustment due to the maximum volume limit. The notification may further prompt the user to indicate whether the maximum volume limit is to be overridden or modified. In one case, this may require the user to provide indication, such as entering a passcode to indicate qualifications or permission to override or modify the maximum volume limit, as discussed above.

In a further example, maximum volume indicators such as the maximum volume indicators 912, 922, or 972 may not be displayed on the user interface until a respective maximum volume limit becomes relevant. That is, the maximum volume indicator may only appear on the user interface when the maximum volume limit has been reached. In yet another example, the maximum volume indicator may be displayed or hidden based on settings configurable by the user. Further, the user interface may be configured such that the user may toggle between displaying or hiding the maximum volume indicator by preconfigured gestures such as double-tapping or other multi-touch gestures.

IX. Conclusion

As discussed above, in a shared environment where multiple controllers can control and configure multiple players dynamically, user access restrictions for an entire media playback system, a single listening zone, and/or a listening zone group may be applied. For example, control of the volume or volume ranges of the playback system, listening zone, and/or listening zone group, may be restricted to specific users, specific controllers, or specific devices in the system.

In one aspect, a method is provided. The method may involve applying a state variable update associated with a first playback device in a plurality of playback devices. The state variable update may indicate a limited volume range associated with the first playback device. The method may further involve causing the plurality of playback devices to render audio content in synchrony, receiving input data indicating a group volume adjustment for the plurality of playback devices, and causing a playback volume of the first playback device to be adjusted based on the group volume adjustment and the limited volume range.

In another aspect a system including a plurality of playback devices and a processor is provided. The processor may b e configured to execute instructions for applying a state variable update associated with a first playback device in the plurality of playback devices. The state variable update may indicate a limited volume range associated with the first playback device. The processor may further be configured to execute instructions for causing the plurality of playback devices to render audio content in synchrony, receiving input data indicating a group volume adjustment for the plurality of playback devices, and causing a playback volume of the first playback device to be adjusted based on the group volume adjustment and the limited volume range.

In a further aspect, a non-transitory computer-readable medium is provided. The computer-readable medium has instructions stored thereon executable by a computing device to cause the computing device to perform functions involving applying a state variable update associated with a first playback device in a plurality of playback devices. The state variable update may indicate a limited volume range associated with the first playback device. The instructions may further cause the computing device to perform function involving causing the plurality of playback devices to render audio content in synchrony, receiving input data indicating a group volume adjustment for the plurality of playback devices, and causing a playback volume of the first playback device to be adjusted based on the group volume adjustment and the limited volume range.

The description discloses various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

Additionally, reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

The invention claimed is:

1. A system comprising:
a plurality of playback devices, wherein the plurality of playback devices comprises (i) a first playback device comprising a pair of headphones and (ii) one or more second playback devices, wherein at least one of the playback devices of the plurality of playback devices comprises tangible, non-transitory, computer-readable media storing instructions executable by one or more processors to cause the at least one of the playback devices of the plurality of playback devices to perform operations comprising:
determining a presence of the first playback device;
in response to determining the presence of the first playback device, applying a first state variable update associated with the plurality of playback devices, wherein the first state variable update indicates a limited volume range associated with the plurality of playback devices;
rendering audio content in synchrony with the plurality of playback devices;
receiving input data indicating a group volume adjustment for the plurality of playback devices; and
adjusting a playback volume of the first playback device based on the group volume adjustment and the limited volume range.

2. The system of claim 1, wherein the operations further comprise:
determining an absence of the first playback device; and
in response to determining the absence of the first playback device, applying a second state variable update associated with the plurality of playback devices, wherein the second state variable update indicates a maximum volume range associated with the plurality of playback devices.

3. The system of claim 1, wherein the first state variable update includes information about the first playback device, and wherein the limited volume range is based off of the information about the first playback device.

4. The system of claim 1, wherein the operations further comprise grouping the first playback device with the one or more second playback devices, wherein applying the first state variable update comprises applying the first state variable update after the grouping.

5. The system of claim 4, further comprising one or more third playback devices, wherein the grouping comprises grouping the first playback device with the one or more third playback devices, and wherein each of the one or more second playback devices is associated with a first channel and each of the one or more third playback devices is associated with a second channel different than the first channel.

6. The system of claim 1, wherein the limited volume range comprises a maximum frequency, and wherein the maximum frequency is below mid-range frequency and treble frequency components of the audio content.

7. The system of claim 1, wherein the first state variable update further indicates one or more of (i) a playback device play mode associated with the limited volume range, and (ii) a time frame associated with the limited volume range.

8. A tangible, non-transitory computer-readable medium having stored thereon program instructions executable by one or more processors to cause at least one playback device of a plurality of playback devices to perform a method comprising:
  determining a presence of a first playback device, wherein the first playback device comprises a pair of headphones;
  in response to determining the presence of the first playback device, applying a first state variable update associated with a plurality of playback devices, wherein the plurality of playback devices comprises (i) the first playback device and (ii) one or more second playback devices, and wherein the first state variable update indicates a limited volume range associated with the plurality of playback devices;
  rendering audio content in synchrony with the plurality of playback devices;
  receiving input data indicating a group volume adjustment for the plurality of playback devices; and
  adjusting a playback volume of the first playback device based on the group volume adjustment and the limited volume range.

9. The tangible, non-transitory computer-readable medium of claim 8, wherein the method further comprises:
  determining an absence of the first playback device; and
  in response to determining the absence of the first playback device, applying a second state variable update associated with the plurality of playback devices, wherein the second state variable update indicates a maximum volume range associated with the plurality of playback devices.

10. The tangible, non-transitory computer-readable medium of claim 8, wherein the first state variable update includes information about the first playback device, and wherein the limited volume range is based off of the information about the first playback device.

11. The tangible, non-transitory computer-readable medium of claim 8, wherein the method further comprises grouping the first playback device with the one or more second playback devices, wherein applying the first state variable update comprises applying the first state variable update after the grouping.

12. The tangible, non-transitory computer-readable medium of claim 11, wherein the plurality of playback devices further comprises one or more third playback devices, wherein the grouping comprises grouping the first playback device with the one or more third playback devices, and wherein each of the one or more second playback devices is associated with a first channel and each of the one or more third playback devices is associated with a second channel different than the first channel.

13. The tangible, non-transitory computer-readable medium of claim 8, wherein the limited volume range comprises a maximum frequency, and wherein the maximum frequency is below mid-range frequency and treble frequency components of the audio content.

14. The tangible, non-transitory computer-readable medium of claim 8, wherein the first state variable update further indicates one or more of (i) a playback device play mode associated with the limited volume range, and (ii) a time frame associated with the limited volume range.

15. A method comprising:
  determining a presence of a first playback device, wherein the first playback device comprises a pair of headphones;
  in response to determining the presence of the first playback device, applying a first state variable update associated with a plurality of playback devices, wherein the plurality of playback devices comprises (i) the first playback device and (ii) one or more second playback devices, and wherein the first state variable update indicates a limited volume range associated with the plurality of playback devices;
  rendering audio content in synchrony with the plurality of playback devices;
  receiving input data indicating a group volume adjustment for the plurality of playback devices; and
  adjusting a playback volume of the first playback device based on the group volume adjustment and the limited volume range.

16. The method of claim 15, further comprising:
  determining an absence of the first playback device; and
  in response to determining the absence of the first playback device, applying a second state variable update associated with the plurality of playback devices, wherein the second state variable update indicates a maximum volume range associated with the plurality of playback devices.

17. The method of claim 15, wherein the first state variable update includes information about the first playback device, and wherein the limited volume range is based off of the information about the first playback device.

18. The method of claim 15, further comprising grouping the first playback device with the one or more second playback devices, wherein applying the first state variable update comprises applying the first state variable update after the grouping.

19. The method of claim 18, wherein the plurality of playback devices further comprises one or more third playback devices, wherein the grouping comprises grouping the first playback device with the one or more third playback devices, and wherein each of the one or more second playback devices is associated with a first channel and each of the one or more third playback devices is associated with a second channel different than the first channel.

20. The method of claim 15, wherein the first state variable update further indicates one or more of (i) a playback device play mode associated with the limited volume range, and (ii) a time frame associated with the limited volume range.

* * * * *